US011610920B2

(12) United States Patent
Chen et al.

(10) Patent No.: US 11,610,920 B2
(45) Date of Patent: Mar. 21, 2023

(54) PIXEL ARRAY SUBSTRATE

(71) Applicant: Au Optronics Corporation, Hsinchu (TW)

(72) Inventors: Ping-Wen Chen, Hsinchu (TW); Min-Tse Lee, Hsinchu (TW); Sheng-Yen Cheng, Hsinchu (TW); Yueh-Hung Chung, Hsinchu (TW); Yueh-Chi Wu, Hsinchu (TW); Shu-Wen Liao, Hsinchu (TW); Ti-Kuei Yu, Hsinchu (TW); Ya-Ling Hsu, Hsinchu (TW); Chen-Hsien Liao, Hsinchu (TW)

(73) Assignee: Au Optronics Corporation, Hsinchu (TW)

( * ) Notice: Subject to any disclaimer, the term of this patent is extended or adjusted under 35 U.S.C. 154(b) by 175 days.

(21) Appl. No.: 17/017,706

(22) Filed: Sep. 11, 2020

(65) Prior Publication Data

US 2021/0175255 A1 Jun. 10, 2021

Related U.S. Application Data

(60) Provisional application No. 62/943,450, filed on Dec. 4, 2019.

(30) Foreign Application Priority Data

May 22, 2020 (TW) .................................. 109117074

(51) Int. Cl.
*H01L 27/12* (2006.01)
(52) U.S. Cl.
CPC .................................. *H01L 27/124* (2013.01)

(58) Field of Classification Search
CPC .......................... H01L 27/124; G02F 1/136286
See application file for complete search history.

(56) References Cited

U.S. PATENT DOCUMENTS

| 9,646,559 | B2 | 5/2017 | Min et al. |
| 2014/0043306 | A1 | 2/2014 | Min et al. |
| 2019/0369452 | A1* | 12/2019 | Long ................. G02F 1/136286 |
| 2020/0278584 | A1* | 9/2020 | Kajita ............... G02F 1/136286 |

FOREIGN PATENT DOCUMENTS

| CN | 101770743 | | 7/2010 | |
| CN | 103578443 | | 2/2014 | |
| KR | 20150001430 | A * | 1/2015 | ........... H01L 27/124 |
| TW | I694362 | | 5/2020 | |

* cited by examiner

*Primary Examiner* — Peter M Albrecht
(74) *Attorney, Agent, or Firm* — JCIPRNET

(57) ABSTRACT

A pixel array substrate includes data lines, first gate lines, pixel structures, first common lines, and conductive line sets. The conductive line sets are arranged in a first direction. Each of the conductive line sets includes first conductive line groups and a second conductive line group sequentially arranged in the first direction. Each of the first conductive line groups includes second gate lines and a second common line. The second conductive line group includes first auxiliary lines and a second common line. An arrangement order of the second gate lines and the second common line of each of the first conductive line groups in the first direction are the same as an arrangement order of the first auxiliary lines and the second common line of the second conductive line group in the first direction, respectively.

6 Claims, 12 Drawing Sheets

PIXEL ARRAY SUBSTRATE

CROSS-REFERENCE TO RELATED APPLICATION

This application claims the priority benefits of U.S. provisional application Ser. No. 62/943,450, filed on Dec. 4, 2019, and Taiwan application serial no. 109117074, filed on May 22, 2020. The entirety of each of the above-mentioned patent applications is hereby incorporated by reference herein and made a part of this specification.

BACKGROUND OF THE INVENTION

Field of the Invention

The invention relates to a pixel array substrate.

Description of Related Art

With the development of display technology, the requirements for display devices go beyond optical characteristics such as high resolution, high contrast, and wide viewing angles. Display devices are also expected to have an elegant appearance. For example, a display device is expected to have a narrow frame or even no frame.

Generally speaking, a display device includes a plurality of pixel structures disposed in the display area, a data drive circuit disposed under the display area, and a gate drive circuit disposed on the left, right, or both sides of the display area. In order to reduce the width of the left and right sides of the frame of the display device, both the gate drive circuit and the data drive circuit may be disposed on the lower side of the display area. When the gate drive circuit is disposed on the lower side of the display area, the horizontal gate line may only be electrically connected to the gate drive circuit via the vertical gate line. However, not every pixel structure is provided with a vertical gate line next to it. Therefore, the electric field distribution experienced by the plurality of pixel structures is different, which may cause display abnormalities (for example: rainy V lines).

SUMMARY OF THE INVENTION

The invention provides a pixel array substrate with good performance.

The invention provides another pixel array substrate also with good performance.

The invention provides yet another pixel array substrate also with good performance.

A pixel array substrate of an embodiment of the invention includes a base, a plurality of data lines, a plurality of first gate lines, a plurality of pixel structures, a plurality of first common lines, and a plurality of conductive line sets. The plurality of data lines are disposed on the base and arranged in a first direction. The plurality of first gate lines are disposed on the base and arranged in a second direction staggered with the first direction. The plurality of pixel structures are disposed on the base and electrically connected to the plurality of data lines and the plurality of first gate lines. The plurality of first common lines are disposed on the base, arranged in the second direction, and overlapped with the plurality of pixel structures. The plurality of conductive line sets are disposed on the base and arranged in the first direction. Each of the conductive line sets includes a plurality of first conductive line groups and a second conductive line group sequentially arranged in the first direction. Each of the first conductive line groups includes a plurality of second gate lines and a second common line, the plurality of second gate lines of each of the first conductive line groups are electrically connected to the plurality of first gate lines, and the second common line of each of the first conductive line groups is electrically connected to at least one of the plurality of first common lines. The second conductive line group includes a plurality of first auxiliary lines and a second common line, and the second common line of the second conductive line group is electrically connected to at least one of the plurality of first common lines. In particular, an arrangement order of the plurality of second gate lines and the second common line of each of the first conductive line groups in the first direction is the same as an arrangement order of the plurality of first auxiliary lines and the second common line of the second conductive line group in the first direction, respectively.

A pixel array substrate of another embodiment of the invention includes a base, a plurality of data lines, a plurality of first gate lines, a plurality of pixel structures, a plurality of first common lines, and a plurality of conductive line sets. The plurality of data lines are disposed on the base and arranged in a first direction. The plurality of first gate lines are disposed on the base and arranged in a second direction staggered with the first direction. The plurality of pixel structures are disposed on the base and electrically connected to the plurality of data lines and the plurality of first gate lines. The plurality of first common lines are disposed on the base, arranged in the second direction, and overlapped with the plurality of pixel structures. The plurality of conductive line sets are disposed on the base and arranged in the first direction. Each of the conductive line sets includes a plurality of first conductive line groups and a second conductive line group sequentially arranged in the first direction. Each of the first conductive line groups includes a plurality of second gate lines and a second common line, the plurality of second gate lines of each of the first conductive line groups are electrically connected to the plurality of first gate lines, and the second common line of each of the first conductive line groups is electrically connected to at least one of the plurality of first common lines. The second conductive line group includes a second gate line, a first auxiliary line, and a second common line, the second gate line of the second conductive line group is electrically connected to one of the plurality of first gate lines, and the second common line of the second conductive line group is electrically connected to at least one of the plurality of first common lines. In particular, an arrangement order of the plurality of second gate lines and the second common line of each of the first conductive line groups in the first direction is the same as an arrangement order of the second gate line, the first auxiliary line, and the second common line of the second conductive line group in the first direction, respectively.

A pixel array substrate of yet another embodiment of the invention includes a base, a plurality of data lines, a plurality of first gate lines, a plurality of pixel structures, a plurality of first common lines, and a plurality of conductive line sets. The plurality of data lines are disposed on the base and arranged in a first direction. The plurality of first gate lines are disposed on the base and arranged in a second direction staggered with the first direction. The plurality of pixel structures are disposed on the base and electrically connected to the plurality of data lines and the plurality of first gate lines. The plurality of first common lines are disposed on the base, arranged in the second direction, and overlapped with the plurality of pixel structures. The plurality of conductive line sets are disposed on the base and arranged in the first direction. Each of the conductive line sets includes a plurality of first conductive line groups and a second conductive line group sequentially arranged in the first direction. Each of the first conductive line groups includes a second gate line and a plurality of second common lines. The second gate line of each of the first conductive line groups is electrically connected to one of the plurality of first gate lines. The plurality of second common lines of each of the first conductive line groups are electrically connected to the plurality of first common lines. The second conductive line group includes a first auxiliary line and a plurality of second common lines, and the plurality of second common lines of the second conductive line group are electrically connected to the plurality of first common lines. In particular, an arrangement order of the second gate line and the plurality of second common lines of each of the first conductive line groups in the first direction is the same as an arrangement order of the first auxiliary line and the plurality of second common lines of the second conductive line group in the first direction, respectively.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
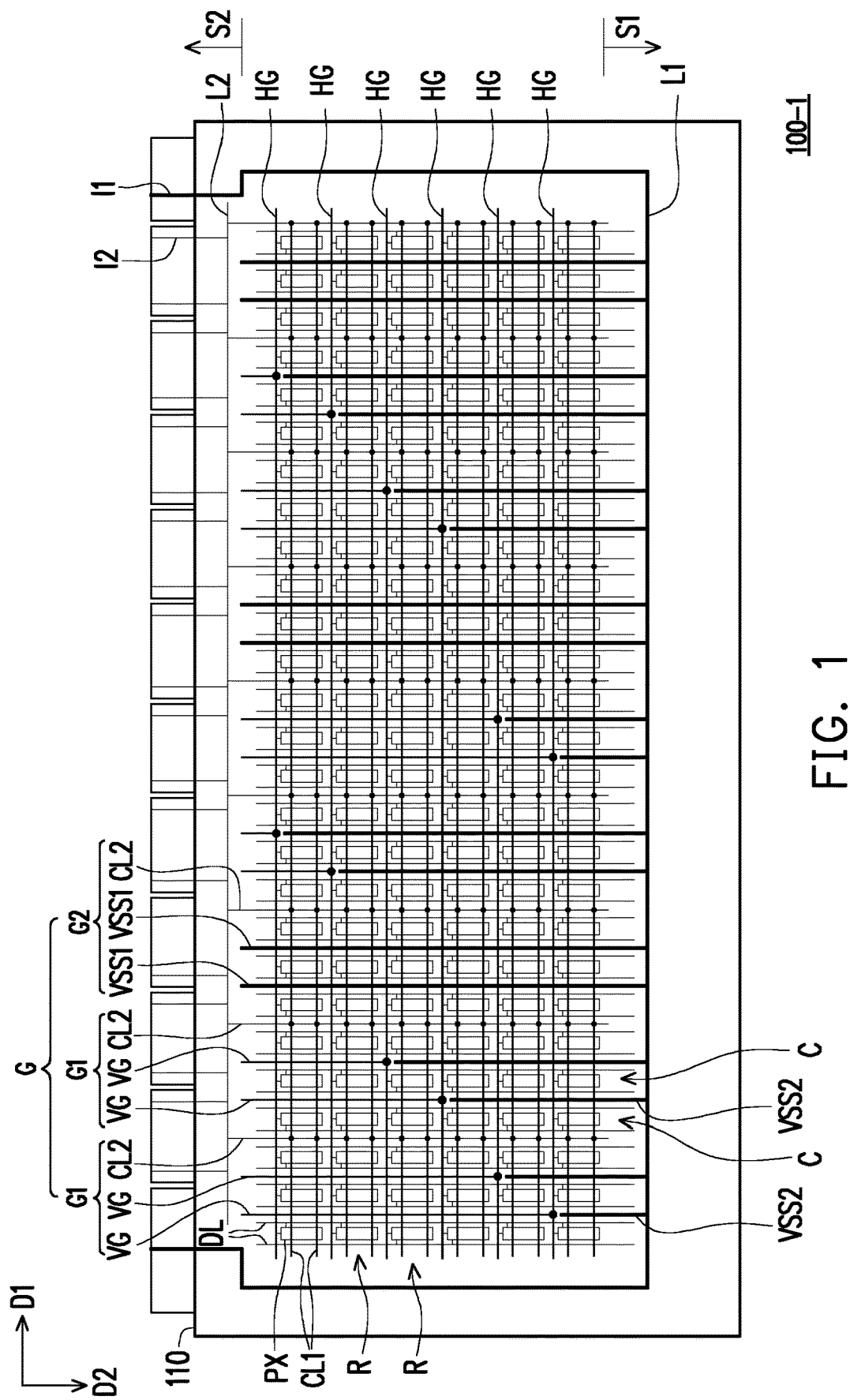
FIG. 1 is a diagram of a pixel array substrate 100-1 of an embodiment of the invention.

Hereinafter, exemplary embodiments of the invention are described in detail, and examples of the exemplary embodiments are conveyed via the figures. Wherever possible, the same reference numerals are used in the figures and the descriptions to refer to the same or similar portions.

It should be understood that, when a layer, film, region, or an element of a substrate is "on" another element or "connected to" another element, the element may be directly on the other element or connected to the other element, or an intermediate element may also be present. On the other hand, when an element is "directly on another element" or "directly connected to" another element, an intermediate element is not present. As used in the present specification, "connected to" may refer to a physical and/or electrical connection. Furthermore, "electrically connected" or "coupled" may mean that other elements are present between two elements.

"About", "similar", or "substantially" used in the present specification include the value and the average value within an acceptable deviation range of a specific value confirmed by those having ordinary skill in the art, and the concerned measurement and a specific quantity (i.e., limitations of the measuring system) of measurement-related errors are taken into consideration. For instance, "about" may represent within one or a plurality of standard deviations of the value, or within ±30%, ±20%, ±10%, or ±5%. Moreover, "about", "similar", or "substantially" used in the present specification may include a more acceptable deviation range or standard deviation according to optical properties, etching properties, or other properties, and one standard deviation does not need to apply to all of the properties.

Unless otherwise stated, all of the terminology used in the present specification (including technical and scientific terminology) have the same definition as those commonly understood by those skilled in the art of the invention. It should be further understood that, terminology defined in commonly-used dictionaries should be interpreted to have the same definitions in related art and in the entire specification of the invention, and are not interpreted as ideal or overly-formal definitions unless clearly stated as such in the present specification.

FIG. 1 is a diagram of a pixel array substrate 100-1 of an embodiment of the invention.

Please refer to FIG. 1, the pixel array substrate 100-1 includes a base 110. The base 110 is configured to carry other elements of the pixel array substrate 100-1. For example, in the present embodiment, the material of the base 110 may be glass, quartz, organic polymer, or other applicable materials.

The pixel array substrate 100-1 further includes a plurality of data lines DL, a plurality of first gate lines HG, and a plurality of pixel structures PX disposed on the base 110.

The plurality of data lines DL are disposed on the base 110 and arranged in a first direction D1. The plurality of first gate lines HG are disposed on the base 110 and arranged in a second direction D2. The first direction D1 is staggered with the second direction D2. For example, in the present embodiment, the first direction D1 and the second direction D2 may substantially be perpendicular, but the invention is not limited thereto.

In the present embodiment, the data lines DL and the first gate lines HG may belong to different layers. For example, in the present embodiment, the first gate lines HG may belong to a first metal layer, and the data lines DL may belong to a second metal layer, but the invention is not limited thereto. Based on the consideration of conductivity, in the present embodiment, the data lines DL and the first gate lines HG adopt a metal material; however, the invention is not limited thereto. In other embodiments, the data lines DL and/or the first gate lines HG may also adopt other conductive materials, such as alloys, nitrides of metal materials, oxides of metal materials, oxynitrides of metal materials, or stacked layers of metal materials and other conductive materials.

The plurality of pixel structures PX are disposed on the base 110 and electrically connected to the plurality of data lines DL and the plurality of first gate lines HG. Specifically, in the present embodiment, each of the pixel structures PX may include a thin-film transistor (not shown) and a pixel electrode (not shown), wherein the thin-film transistor has a first end, a second end, and a control end, the first end of the thin-film transistor is electrically connected to a corresponding data line DL, the control terminal of the thin-film transistor is electrically connected to a corresponding first gate line HG, and the second end of the thin-film transistor is electrically connected to the pixel electrode.

The pixel array substrate 100-1 further includes a plurality of first common lines CL1. The plurality of first common lines CL1 are disposed on the base 110 and arranged in the second direction D2. The plurality of first common lines CL1 are overlapped with the plurality of pixel structures PX. For example, in the present embodiment, the plurality of pixel structures PX are arranged into a plurality of pixel rows R, the plurality of pixel structures PX of each of the pixel rows R are arranged in the first direction D1, and the two sides of the plurality of pixel electrodes (not shown) of the plurality of pixel structures PX of each of the pixel rows R may be overlapped with two first common lines CL1, respectively. However, the invention is not limited thereto, and the first common lines CL1 may also be disposed in the pixel array substrate 100-1 in other ways.

In the present embodiment, the first common lines CL1 and the data lines DL may belong to different layers. For example, in the present embodiment, the first common lines CL1 may belong to a first metal layer, and the data lines DL may belong to a second metal layer, but the invention is not limited thereto. Based on the consideration of conductivity, in the present embodiment, the first common lines CL1 adopt a metal material; however, the invention is not limited thereto. In other embodiments, the first common lines CL1 may also adopt other conductive materials, such as alloys, nitrides of metal materials, oxides of metal materials, oxynitrides of metal materials, or stacked layers of metal materials and other conductive materials.

The pixel array substrate 100-1 further includes a plurality of conductive line sets G disposed on the base 110 and arranged in the first direction D1. Each of the conductive line sets G includes a plurality of first conductive line groups G1 and a second conductive line group G2 sequentially arranged in the first direction D1.

In the present embodiment, each of the first conductive line groups G1 may include a plurality of second gate lines VG and a second common line CL2, wherein the plurality of second gate lines VG are electrically connected to the plurality of first gate lines HG, and the second common line CL2 is electrically connected to at least one of the plurality of first common lines CL1.

The plurality of pixel structures PX are arranged into a plurality of pixel columns C, the plurality of pixel columns C are arranged in the first direction D1, and the plurality of pixel structures PX of each of the pixel columns C are arranged in the second direction D2. Specifically, in the present embodiment, in the top view of the pixel array substrate 100-1, a plurality of layout areas are between the plurality of pixel columns C, and the plurality of second gate lines VG and the plurality of second common lines CL2 of the plurality of first conductive line groups G1 of the conductive line set G are disposed in the plurality of layout areas, respectively. In the present embodiment, it is preferable that each of the second gate lines VG is disposed between two adjacent pixel columns C respectively for displaying red and blue, but the invention is not limited thereto.

In the present embodiment, the plurality of second gate lines VG are arranged in the first direction D1, the plurality of first gate lines HG are arranged in the second direction D2, and the second gate lines VG and the first gate lines HG may belong to different layers. For example, in the present embodiment, the first gate lines HG may belong to a first metal layer, and the second gate lines VG may belong to a second metal layer. However, the invention is not limited thereto. In other embodiments, the second gate lines VG may also be formed by connecting a plurality of conductive line segments respectively belonging to a plurality of conductive layers (for example, the first metal layer and the second metal layer).

Based on the consideration of conductivity, in the present embodiment, the second gate lines VG adopt a metal material; however, the invention is not limited thereto. In other embodiments, the second gate lines VG may also adopt other conductive materials, such as alloys, nitrides of metal materials, oxides of metal materials, oxynitrides of metal materials, or stacked layers of metal materials and other conductive materials.

In the present embodiment, the plurality of second common lines CL2 of the plurality of first conductive line groups G1 are arranged in the first direction D1, the plurality of first common lines CL1 are arranged in the second direction D2, and the second common lines CL2 and the first common lines CL1 may belong to different layers. For example, in the present embodiment, the second common lines CL2 may belong to a second metal layer, and the first common lines CL1 may belong to a first metal layer. However, the invention is not limited thereto. In other embodiments, each of the second common lines CL2 may also be formed by connecting a plurality of conductive line segments respectively belonging to a plurality of conductive layers (for example, the first metal layer and the second metal layer).

In the present embodiment, the second conductive line group G2 of the conductive line set G includes a plurality of first auxiliary lines VSS1 and a second common line CL2, wherein the second common line CL2 of the second conductive line group G2 is electrically connected to at least one of the plurality of first common lines CL1.

In the present embodiment, in the top view of the pixel array substrate 100-1, a plurality of layout areas are between the plurality of pixel columns C, and the plurality of first auxiliary lines VSS1 and the second common line CL2 of the second conductive line group G2 of the conductive line set G are respectively disposed in the plurality of layout areas.

In the present embodiment, the plurality of first auxiliary lines VSS1 are arranged in the first direction D1, the plurality of first gate lines HG are arranged in the second direction D2, and the first auxiliary lines VSS1 and the first gate lines HG may belong to different layers. For example, in the present embodiment, the first gate lines HG may belong to a first metal layer, and the first auxiliary lines VSS1 may belong to a second metal layer. However, the invention is not limited thereto. In other embodiments, the first auxiliary lines VSS1 may also be formed by connecting a plurality of conductive line segments respectively belonging to a plurality of conductive layers (for example, the first metal layer and the second metal layer).

Based on the consideration of conductivity, in the present embodiment, the first auxiliary lines VSS1 adopt a metal material; however, the invention is not limited thereto. In other embodiments, the first auxiliary lines VSS1 may also adopt other conductive materials, such as alloys, nitrides of metal materials, oxides of metal materials, oxynitrides of metal materials, or stacked layers of metal materials and other conductive materials.

It should be noted that, the plurality of first conductive line groups G1 and the second conductive line group G2 of each of the conductive line sets G are sequentially arranged in the first direction D1, and the arrangement order of the plurality of second gate lines VG and the second common line CL2 of each of the first conductive line groups G1 in the first direction D1 is respectively the same as the arrangement order of the plurality of first auxiliary lines VSS1 and the second common line CL2 of the second conductive line group G2 in the first direction D1.

Thereby, each of the first conductive line groups G1 and the second conductive line group G2 of each of the conductive line sets G may form the same or similar electric field distribution, so that the plurality of pixel structures PX provided adjacent to each of the first conductive line groups G1 and the second conductive line group G2 of each of the conductive line sets G experience the same or similar electric field. In this way, in the prior art, display abnormalities (such as rainy V lines) may be alleviated.

For example, in the present embodiment, the plurality of second gate lines VG and the second common line CL2 of each of the first conductive line groups G1 of each of the conductive line sets G are sequentially arranged in the first direction D1, and the plurality of first auxiliary lines VSS1 and the second common line CL2 of the second conductive line group G2 are sequentially arranged in the first direction D1. That is, in the present embodiment, the plurality of conductive line groups G are arranged in the first direction D1, and each of the conductive line sets G may include a second gate line VG, a second gate line VG, a second common line CL2, a second gate line VG, a second gate line VG, a second common line CL2, a first auxiliary line VSS1, a first auxiliary line VSS1, and a second common line CL2 sequentially arranged in the first direction D1. However, the invention is not limited thereto. In other embodiments, the conductive line set G may also include conductive lines configured in other suitable ways, which is illustrated in the following paragraphs in conjunction with other figures.

In the present embodiment, a plurality of signals of the plurality of first auxiliary lines VSS1 of the second conductive line group G2 of each of the conductive line sets G and a gate-off signal of a second gate line VG of the first conductive line group G1 are substantially the same. That is to say, in most of the time (i.e., when the plurality of thin-film transistors of at least one pixel row R electrically connected to one of the following second gate lines VG does not need to be turned on), a first auxiliary line VSS1 of the second conductive line group G2 has the same signal as a second gate line VG of the first conductive line group G1, and the electric field distribution formed by a first auxiliary line VSS1 of the second conductive line group G2 is substantially the same as the electric field distribution formed by a second gate line VG of the first conductive line group G1. For example, in the present embodiment, the gate-off signal may be a DC signal between −9 V and −10 V; in most of the time, a second gate line VG of the first conductive line group G1 and a first auxiliary line VSS1 of the second conductive line group G2 may both have a DC signal between −9 V and −10 V, but the invention is not limited thereto.

In the present embodiment, a first auxiliary line VSS1 of the second conductive line group G2 has a DC potential DC1, and a second common line CL2 of the first conductive line group G1 has a DC potential DC2, and DC1≠DC2. In the present embodiment, |DC1−DC2|>1 V (volts). For example, in the present embodiment, the DC potential DC1 may be between −9 V and −10 V, and the DC potential DC2 may be between 1 V and 6 V, but the invention is not limited thereto.

In the present embodiment, each of the first conductive line groups G1 may further optionally include a plurality of second auxiliary lines VSS2, wherein each of the second auxiliary lines VSS2 and the second gate line VG of the first conductive line group G1 are disposed between two adjacent pixel columns C, and each of the second auxiliary line VSS2 is structurally separated from the second gate line VG of the first conductive line group G1.

In the present embodiment, the plurality of second auxiliary lines VSS2 of the first conductive line group G1 are electrically connected to the plurality of first auxiliary lines VSS1 of the second conductive line group G2. That is, the second auxiliary lines VSS2 of the first conductive line group G1 and the first auxiliary lines VSS1 of the second conductive line group G2 may have the same potential.

Specifically, in the present embodiment, the pixel array substrate 100-1 further includes a first peripheral wiring L1 disposed on the base 110 and located at a first side S1 of the plurality of pixel structures PX, and the second auxiliary lines VSS2 of the first conductive line group G1 and the first auxiliary lines VSS1 of the second conductive line group G2 may both be directly electrically connected to the first peripheral wiring L1.

The pixel array substrate 100-1 further includes a second peripheral wiring L2 disposed on the base 110 and located at a second side S2 of the plurality of pixel structures PX, and the second common line CL2 of the first conductive line group G1 and the second common line CL2 of the second conductive line group G2 may both be directly electrically connected to the second peripheral wiring L2. The first peripheral wiring L1 and the second peripheral wiring L2 are electrically connected to a driving element (for example, but not limited to: a printed circuit board; not shown) via a first connection line 11 and a second connection line 12 independent of each other, respectively.

It should be mentioned here that, the following embodiments adopt the reference numerals of the embodiments above and a portion of the content thereof, wherein the same reference numerals are used to represent the same or similar devices and descriptions of the same technical content are omitted. The omitted portions are as described in the embodiments above and are not repeated in the embodiments below.

Figure 2:
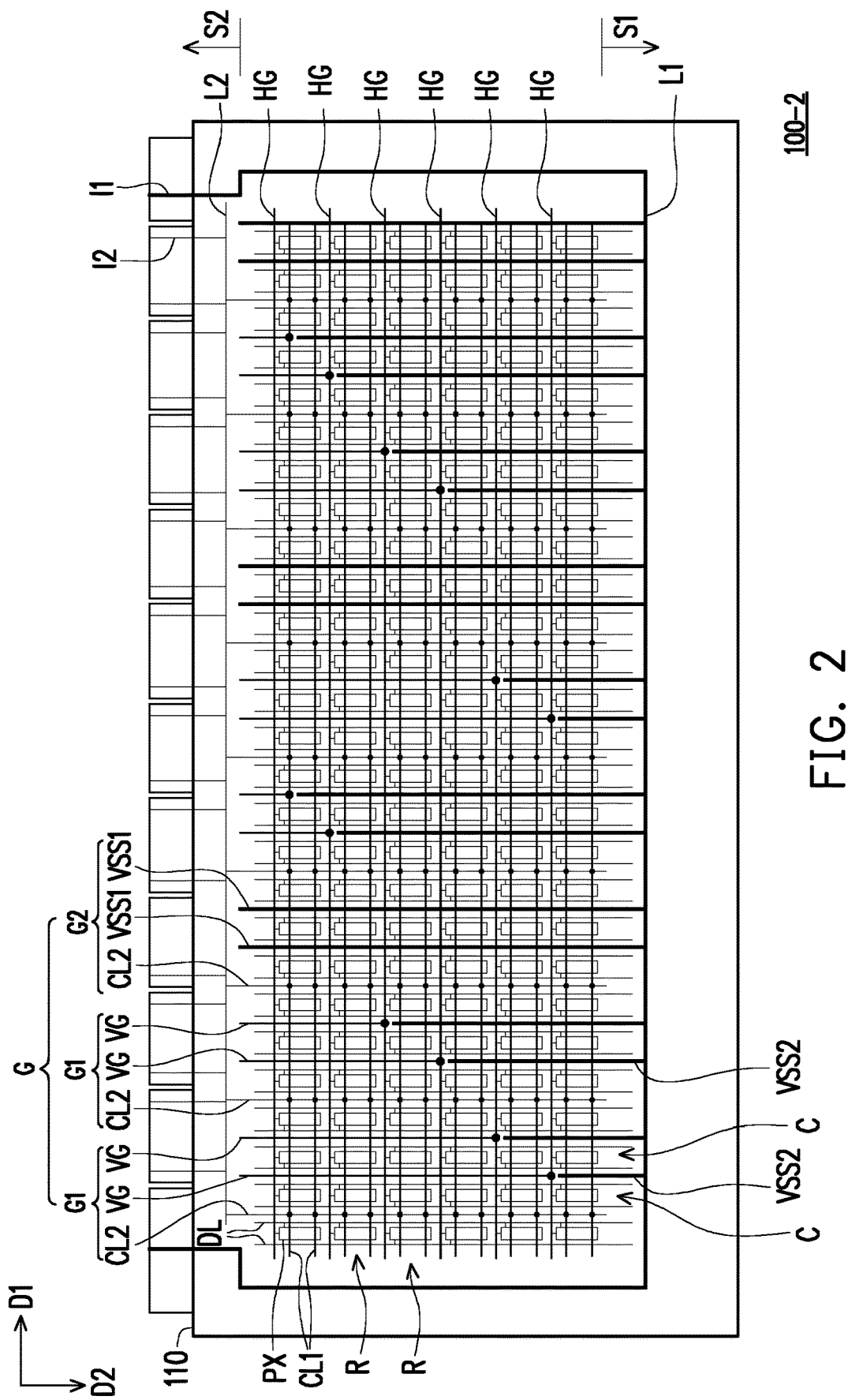
FIG. 2 is a diagram of a pixel array substrate 100-2 of an embodiment of the invention.

FIG. 2 is a diagram of a pixel array substrate 100-2 of an embodiment of the invention.

The pixel array substrate 100-2 of FIG. 2 is similar to the pixel array substrate 100-1 of FIG. 1, and the difference between the two is: the arrangement of the plurality of second gate lines VG, the plurality of second common lines CL2, and the plurality of first auxiliary lines VSS1 of the conductive line sets G of the two is different.

Please refer to FIG. 2. Specifically, in the present embodiment, each of the conductive line sets G includes a second common line CL2, a second gate line VG, a second gate line VG, a second common line CL2, a second gate line VG, a second gate line VG, a second common line CL2, a first auxiliary line VSS1, and a first auxiliary line VSS1 sequentially arranged in the first direction D1.

Figure 3:
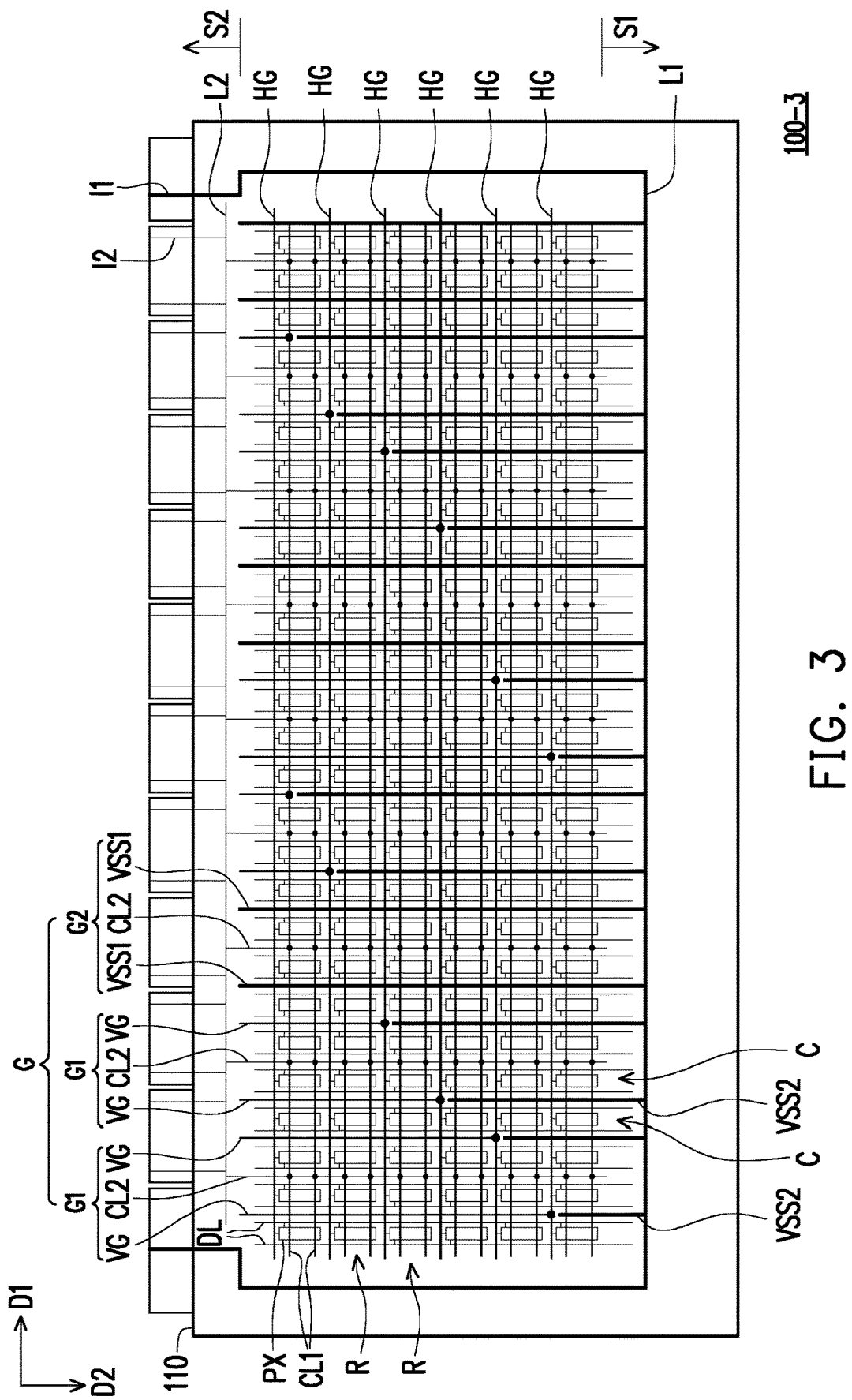
FIG. 3 is a diagram of a pixel array substrate 100-3 of an embodiment of the invention.

FIG. 3 is a diagram of a pixel array substrate 100-3 of an embodiment of the invention.

The pixel array substrate 100-3 of FIG. 3 is similar to the pixel array substrate 100-1 of FIG. 1, and the difference between the two is: the arrangement of the plurality of second gate lines VG, the plurality of second common lines CL2, and the plurality of first auxiliary lines VSS1 of the conductive line sets G of the two is different.

Please refer to FIG. 3. Specifically, in the present embodiment, the second common line CL2 of each of the first conductive line groups G1 is disposed between the plurality of second gate lines VG of the first conductive line group G1, and the second common line CL2 of the second conductive line group G2 is disposed between the plurality of first auxiliary lines VSS1 of the second conductive line group G2. That is, in the present embodiment, each of the conductive line sets G may include a second gate line VG, a second common line CL2, a second gate line VG, a second gate line VG, a second common line CL2, a second gate line VG, a first auxiliary line VSS1, a second common line CL2, and a first auxiliary line VSS1 sequentially arranged in the first direction D1.

Figure 4:
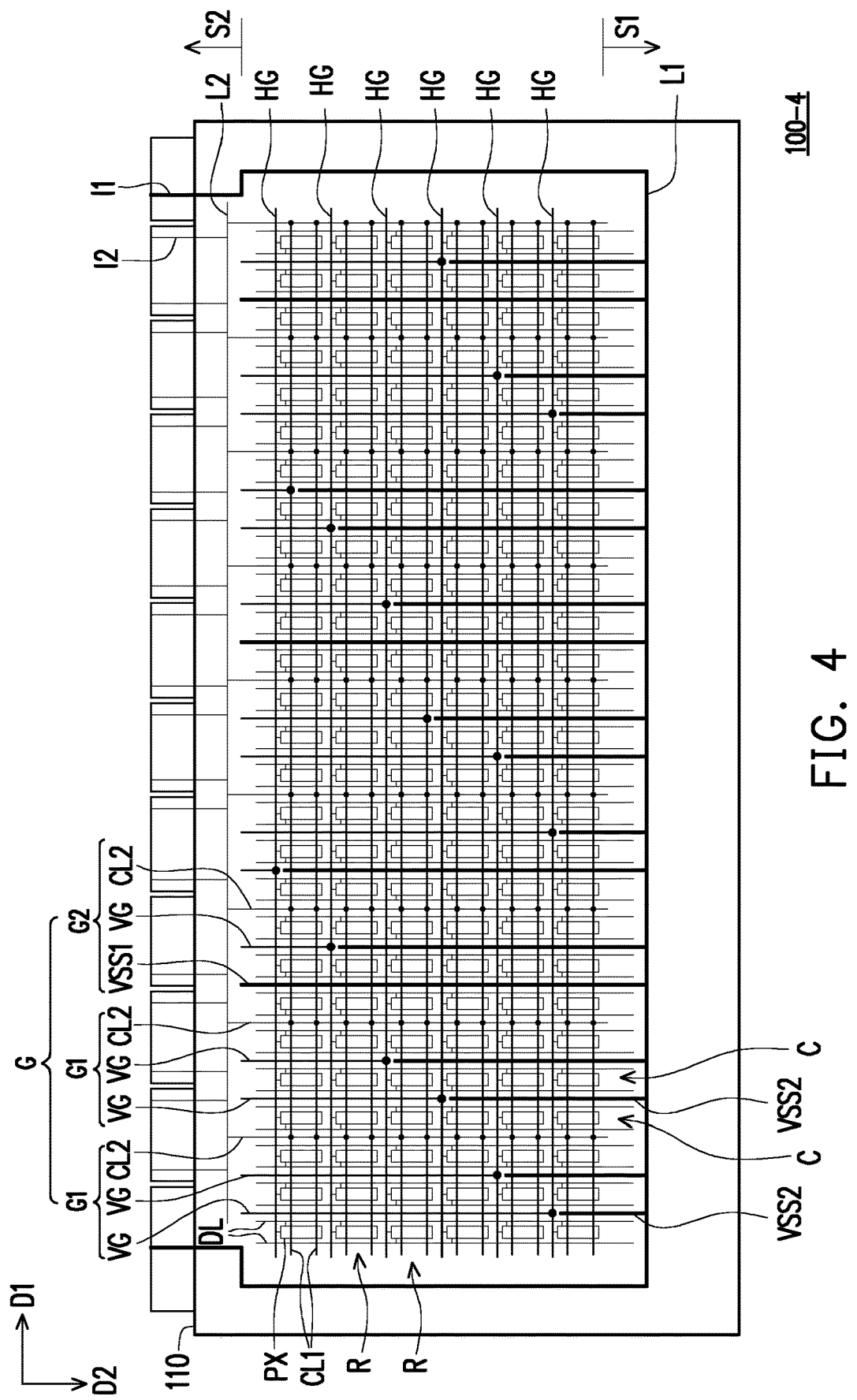
FIG. 4 is a diagram of a pixel array substrate 100-4 of an embodiment of the invention.

FIG. 4 is a diagram of a pixel array substrate 100-4 of an embodiment of the invention. The pixel array substrate 100-4 of FIG. 4 is similar to the pixel array substrate 100-1 of FIG. 1, and the difference between the two is that the composition of the conductive line sets G of the two is different.

Please refer to FIG. 4. Specifically, in the present embodiment, each of the conductive line sets G includes a plurality of first conductive line groups G1 and a second conductive line group G2 sequentially arranged in the first direction D1, wherein each of the first conductive line groups G1 includes a plurality of second gate lines VG and a second common line CL2, the second conductive line group G2 includes a second gate line VG, a first auxiliary line VSS1, and a second common line CL2, and the arrangement order of the plurality of second gate lines VG and the second common line CL2 of each of the first conductive line groups G1 in the first direction D1 is the same as the arrangement order of the second gate line VG, the first auxiliary line VSS1, and the second common line CL2 of the second conductive line group G2 in the first direction D1, respectively.

For example, in the present embodiment, the plurality of second gate lines VG and the second common line CL2 of each of the first conductive line groups G1 are sequentially arranged in the first direction D1, and the first auxiliary line VSS1, the second gate line VG, and the second common line CL2 of the second conductive line group G2 are sequentially arranged in the first direction D1. That is, in the present embodiment, each of the conductive line sets G includes a second gate line VG, a second gate line VG, a second common line CL2, a second gate line VG, a second gate line VG, a second common line CL2, a first auxiliary line VSS1, a second gate line VG, and a second common line CL2 sequentially arranged in the first direction D1.

Figure 5:
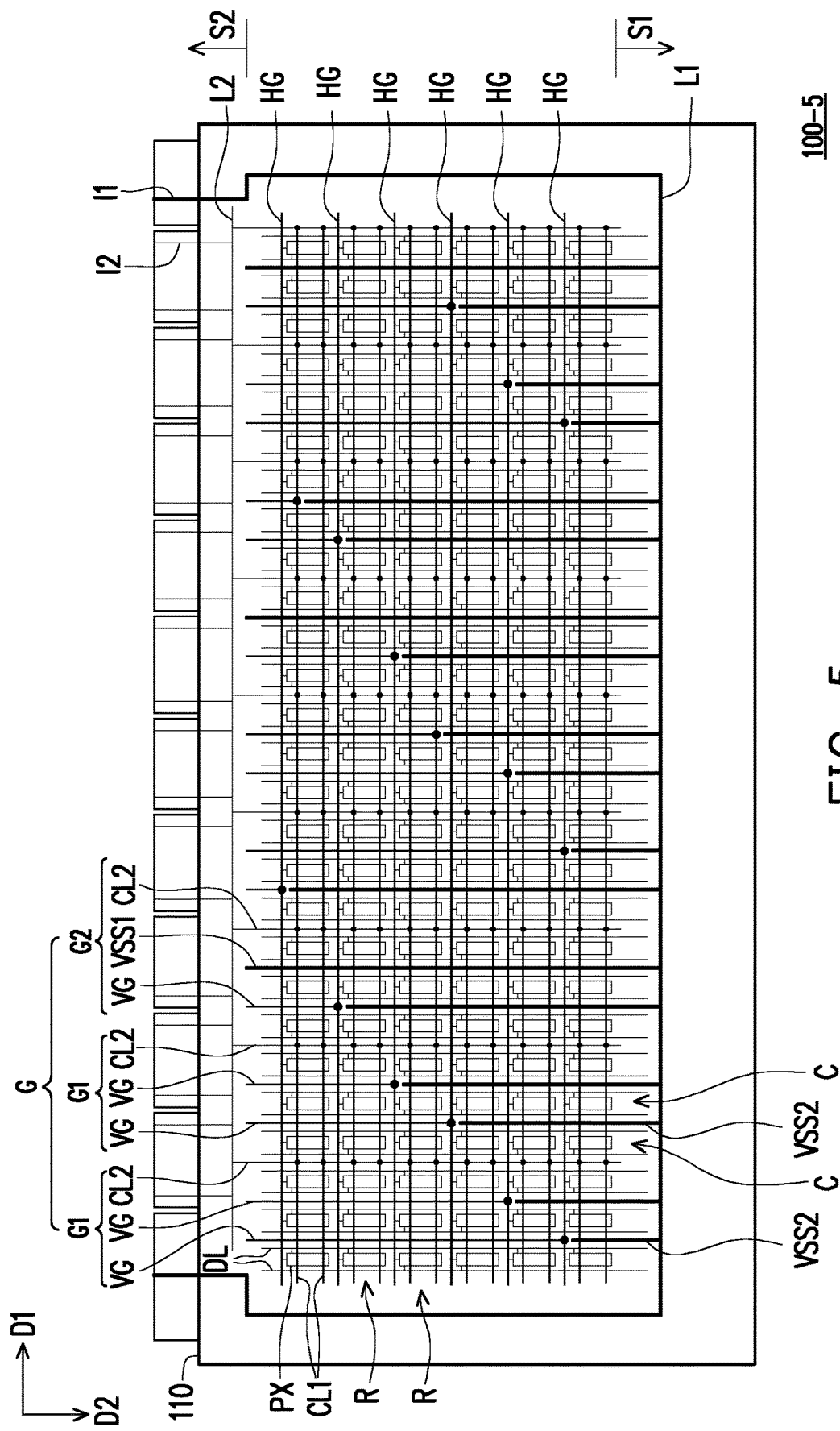
FIG. 5 is a diagram of a pixel array substrate 100-5 of an embodiment of the invention.

FIG. 5 is a diagram of a pixel array substrate 100-5 of an embodiment of the invention.

The pixel array substrate 100-5 of FIG. 5 is similar to the pixel array substrate 100-1 of FIG. 4, and the difference between the two is: the arrangement of the plurality of second gate lines VG, the plurality of second common lines CL2, and the first auxiliary line VSS1 of the conductive line sets G of the two is different.

Referring to FIG. 5, specifically, in the present embodiment, the plurality of second gate lines VG and the second common line CL2 of each of the first conductive line groups G1 are sequentially arranged in the first direction D1, and the second gate line VG, the first auxiliary line VSS1, and the second common line CL2 of the second conductive line group G2 are sequentially arranged in the first direction D1.

That is, in the present embodiment, each of the conductive line sets G includes a second gate line VG, a second gate line VG, a second common line CL2, a second gate line VG, a second gate line VG, a second common line CL2, a second gate line VG, a first auxiliary line VSS1, and a second common line CL2 sequentially arranged in the first direction D1.

Figure 6:
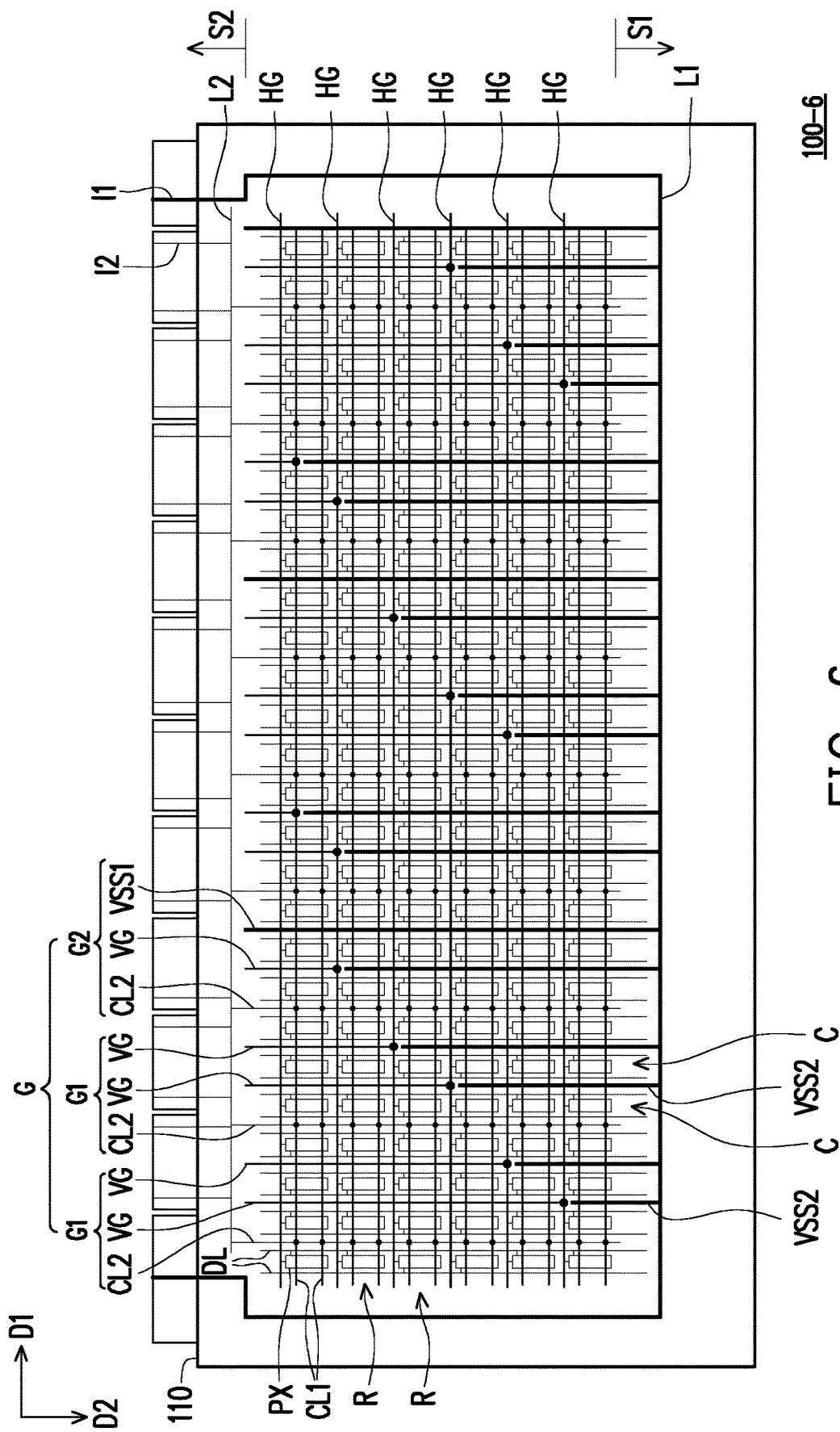
FIG. 6 is a diagram of a pixel array substrate 100-6 of an embodiment of the invention.

FIG. 6 is a diagram of a pixel array substrate 100-6 of an embodiment of the invention.

The pixel array substrate 100-6 of FIG. 6 is similar to the pixel array substrate 100-4 of FIG. 4, and the difference between the two is: the arrangement of the plurality of second gate lines VG, the plurality of second common lines CL2, and the first auxiliary line VSS1 of the conductive line sets G of the two is different.

Please refer to FIG. 6. Specifically, in the present embodiment, each of the conductive line sets G includes a second common line CL2, a second gate line VG, a second gate line VG, a second common line CL2, a second gate line VG, a second gate line VG, a second common line CL2, a second gate line VG, and a first auxiliary line VSS1 sequentially arranged in the first direction D1.

Figure 7:
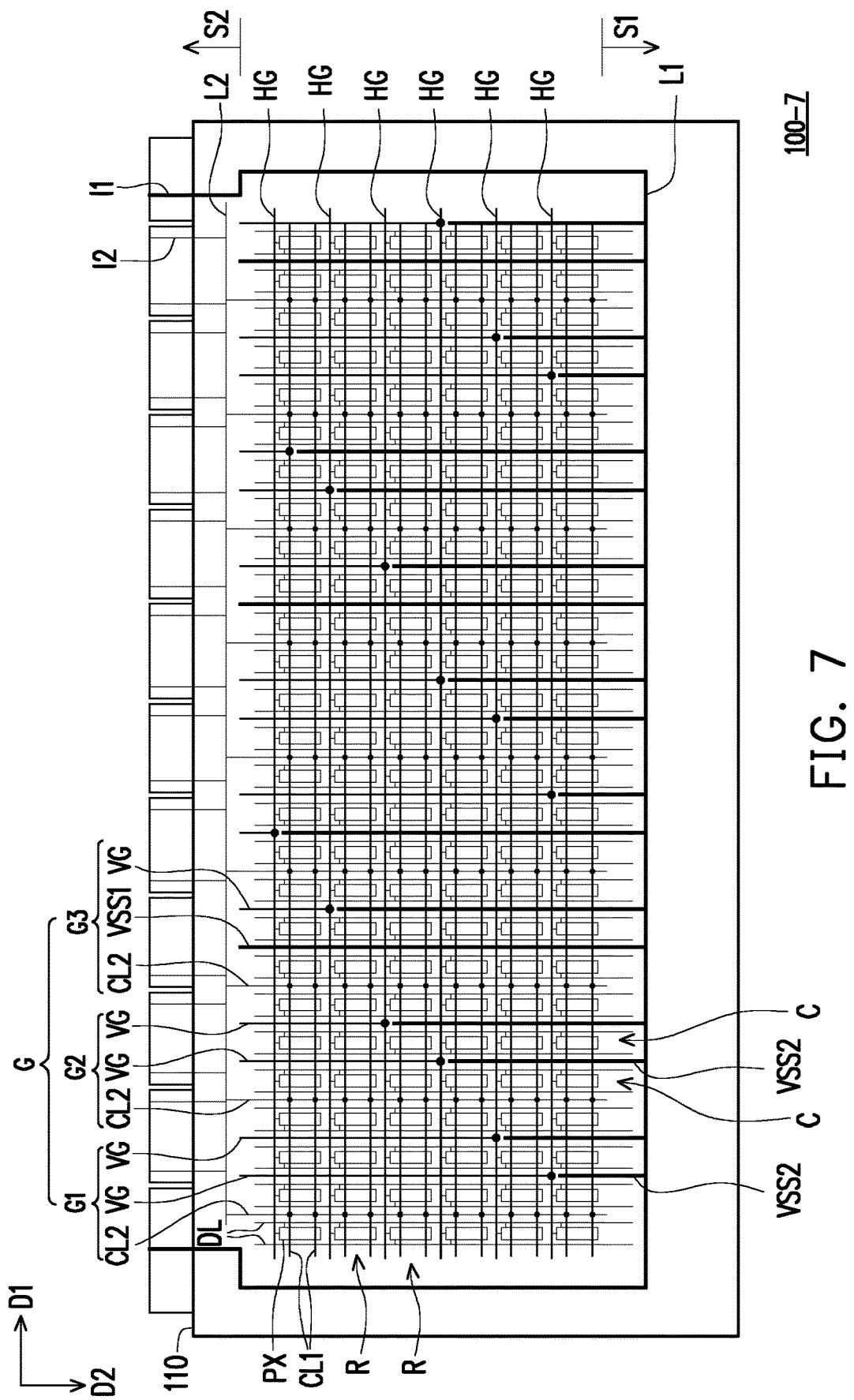
FIG. 7 is a diagram of a pixel array substrate 100-7 of an embodiment of the invention.

FIG. 7 is a diagram of a pixel array substrate 100-7 of an embodiment of the invention.

The pixel array substrate 100-7 of FIG. 7 is similar to the pixel array substrate 100-4 of FIG. 4, and the difference between the two is: the arrangement of the plurality of second gate lines VG, the plurality of second common lines CL2, and the first auxiliary line VSS1 of the conductive line sets G of the two is different.

Please refer to FIG. 7. Specifically, in the present embodiment, each of the conductive line sets G includes a second common line CL2, a second gate line VG, a second gate line VG, a second common line CL2, a second gate line VG, a second gate line VG, a second common line CL2, a first auxiliary line VSS1, and a second gate line VG sequentially arranged in the first direction D1.

Figure 8:
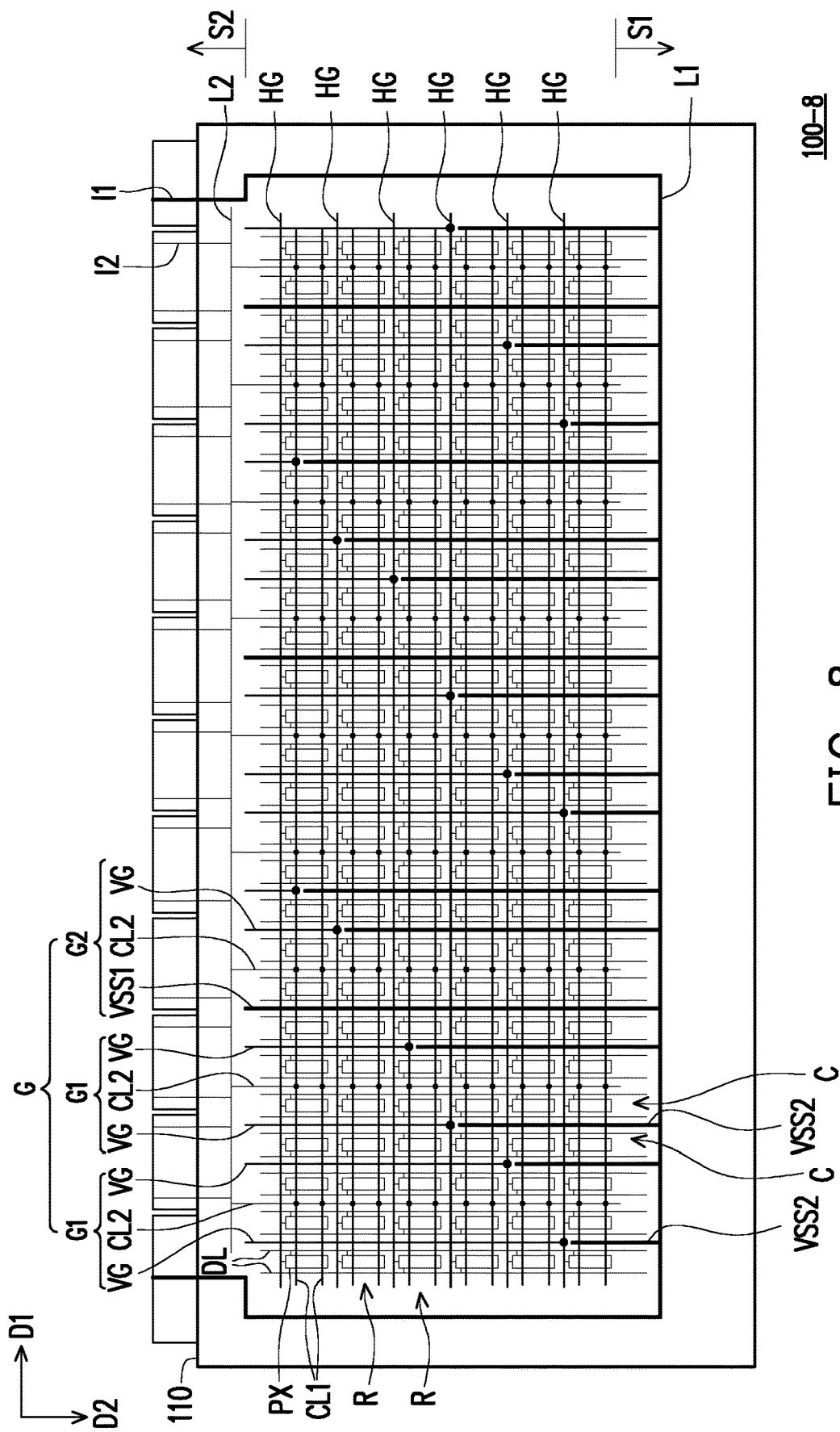
FIG. 8 is a diagram of a pixel array substrate 100-8 of an embodiment of the invention.

FIG. 8 is a diagram of a pixel array substrate 100-8 of an embodiment of the invention.

The pixel array substrate 100-8 of FIG. 8 is similar to the pixel array substrate 100-4 of FIG. 4, and the difference between the two is: the arrangement of the plurality of second gate lines VG, the plurality of second common lines CL2, and the first auxiliary line VSS1 of the conductive line sets G of the two is different.

Please refer to FIG. 8. Specifically, in the present embodiment, the second common line CL2 of each of the first conductive line groups G1 is disposed between the plurality of second gate lines VG of the first conductive line group G1, and the second common line CL2 of the second conductive line group G2 is disposed between the first auxiliary line VSS1 of the second conductive line group G2 and the second gate line VG of the second conductive line group G2. For example, in the present embodiment, the conductive line set G includes a second gate line VG, a second common line CL2, a second gate line VG, a second gate line VG, a second common line CL2, a second gate line VG, a first auxiliary line VSS1, a second common line CL2, and a second gate line VG sequentially arranged in the first direction D1.

Figure 9:
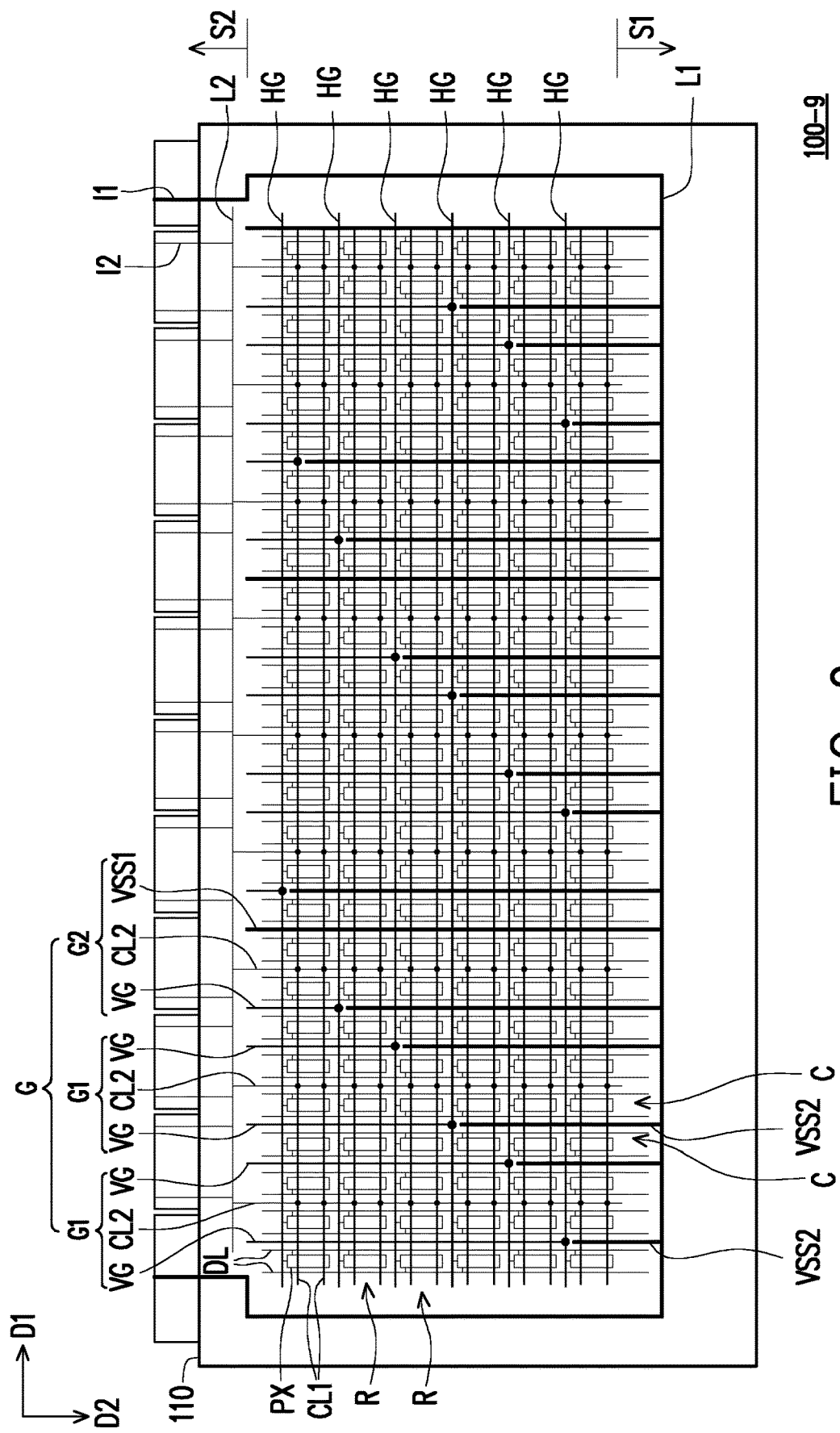
FIG. 9 is a diagram of a pixel array substrate 100-9 of an embodiment of the invention.

FIG. 9 is a diagram of a pixel array substrate 100-9 of an embodiment of the invention.

The pixel array substrate 100-9 of FIG. 9 is similar to the pixel array substrate 100-4 of FIG. 4, and the difference between the two is: the arrangement of the plurality of second gate lines VG, the plurality of second common lines CL2, and the first auxiliary line VSS1 of the conductive line sets G of the two is different.

Please refer to FIG. 9. Specifically, in the present embodiment, the second common line CL2 of each of the first conductive line groups G1 is disposed between the plurality of second gate lines VG of the first conductive line group G1, and the second common line CL2 of the second conductive line group G2 is disposed between the first auxiliary line VSS1 of the second conductive line group G2 and the second gate line VG of the second conductive line group G2. For example, in the present embodiment, the conductive line set G includes a second gate line VG, a second common line CL2, a second gate line VG, a second gate line VG, a second common line CL2, a second gate line VG, a second gate line VG, a second common line CL2, and a first auxiliary line VSS1 sequentially arranged in the first direction D1.

Figure 10:
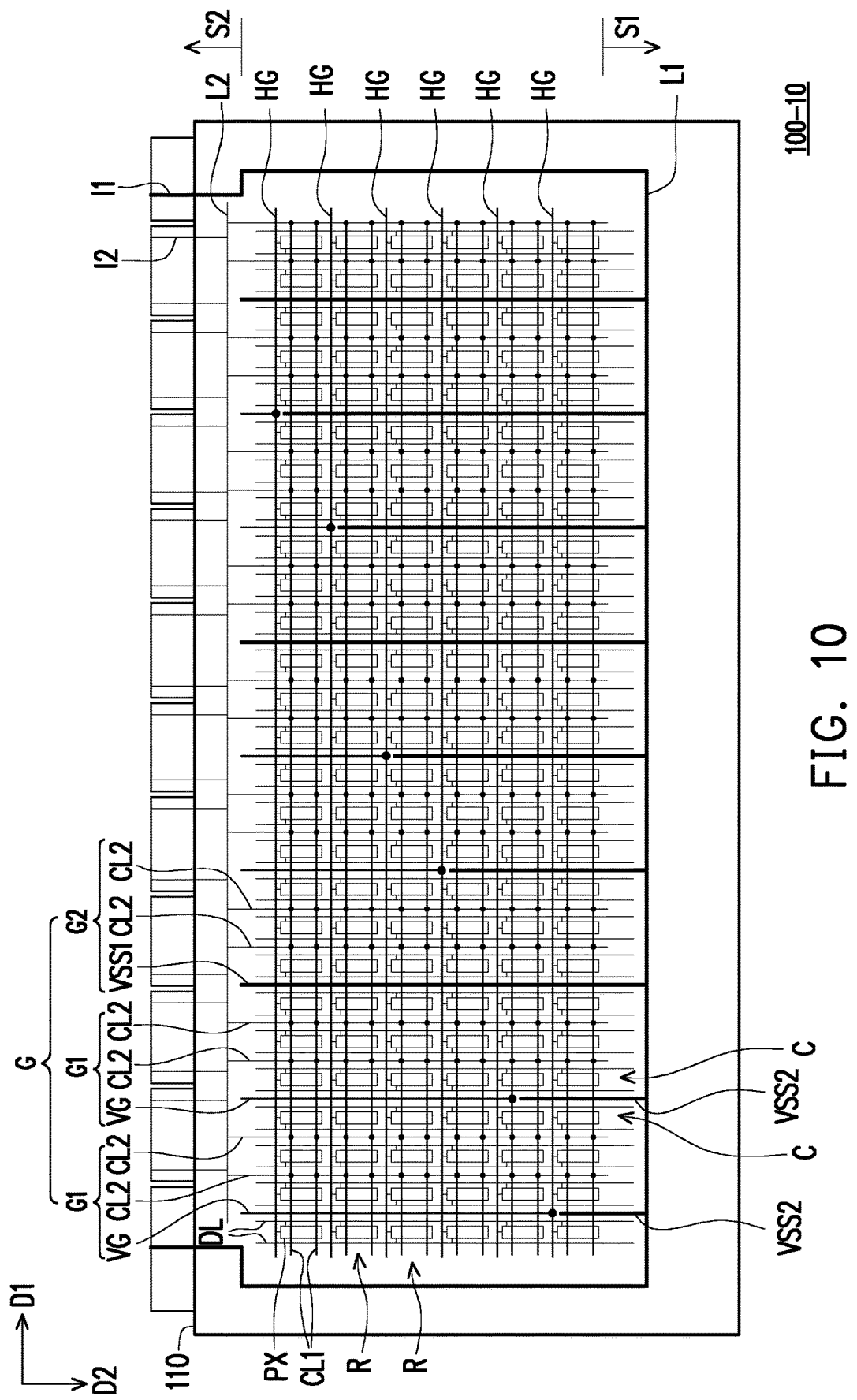
FIG. 10 is a diagram of a pixel array substrate 100-10 of an embodiment of the invention.

FIG. 10 is a diagram of a pixel array substrate 100-10 of an embodiment of the invention.

The pixel array substrate 100-10 of FIG. 10 is similar to the pixel array substrate 100-1 of FIG. 1, and the difference between the two is that the composition of the conductive line sets G of the two is different.

Referring to FIG. 10, specifically, in the present embodiment, each of the conductive line sets G includes a plurality of first conductive line groups G1 and a second conductive line group G2 sequentially arranged in the first direction D1. Each of the first conductive line groups G1 includes a second gate line VG and a plurality of second common lines CL2. The second conductive line group G2 includes a first auxiliary line VSS1 and a plurality of second common lines CL2. In particular, the arrangement order of the second gate line VG and the plurality of second common lines CL2 of each of the first conductive line groups G1 in the first direction D1 is the same as the arrangement order of the first auxiliary line VSS1 and the plurality of second common lines CL2 of the second conductive line group G2 in the first direction, respectively.

For example, in the present embodiment, the second gate line VG and the plurality of second common line CL2 of each of the first conductive line groups G1 are sequentially arranged in the first direction D1, and the first auxiliary line VSS1 and the plurality of second common lines CL2 of the second conductive line group G2 are sequentially arranged in the first direction D1. That is, in the present embodiment, each of the conductive line sets G includes a second gate line VG, a second common line CL2, a second common line CL2, a second gate line VG, a second common line CL2, a second common line CL2, a first auxiliary line VSS1, a second common line CL2, and a second common line CL2 sequentially arranged in the first direction D1.

Figure 11:
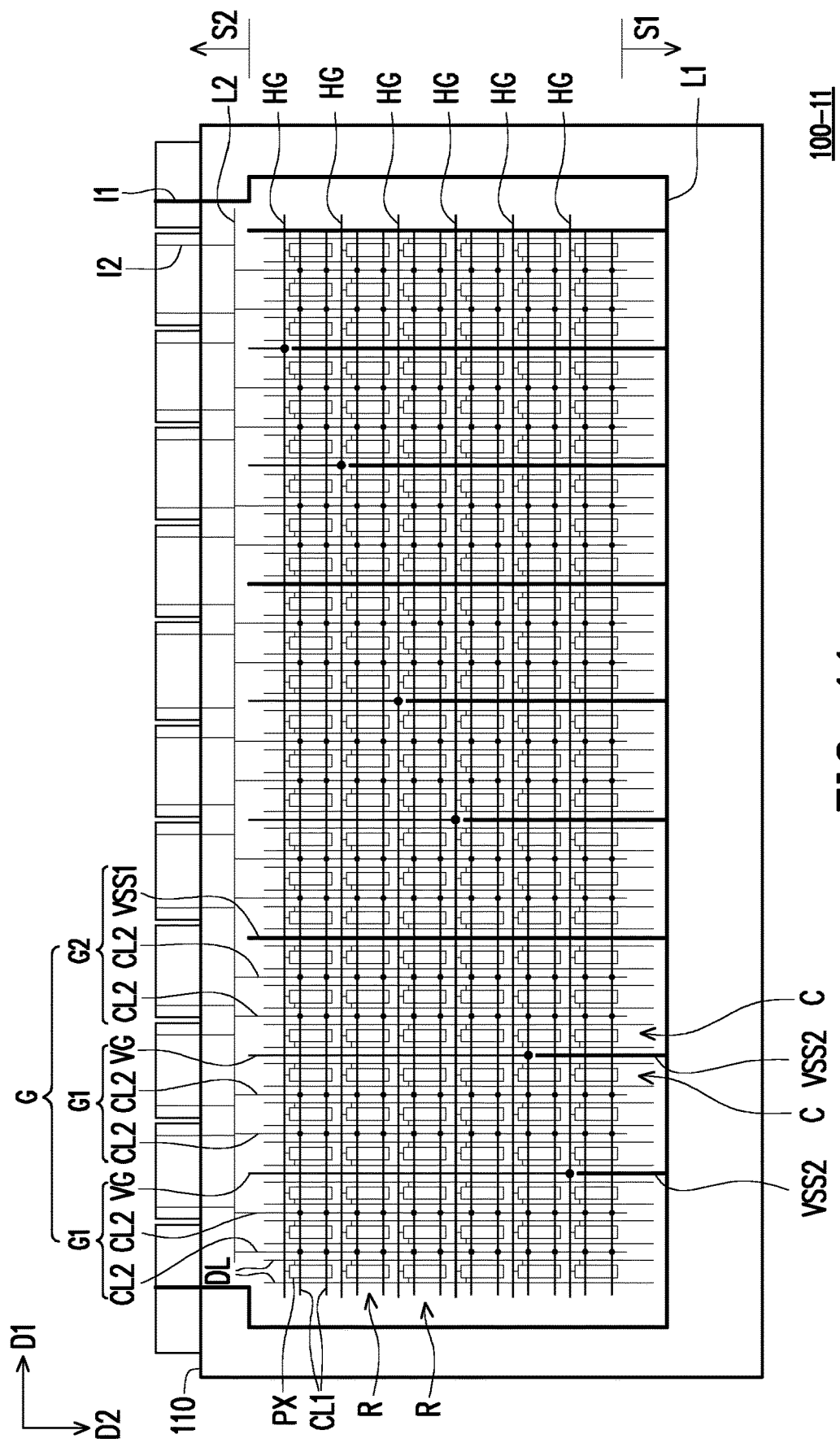
FIG. 11 is a diagram of a pixel array substrate 100-11 of an embodiment of the invention.

FIG. 11 is a diagram of a pixel array substrate 100-11 of an embodiment of the invention.

The pixel array substrate 100-11 of FIG. 11 is similar to the pixel array substrate 100-10 of FIG. 10, and the difference between the two is: the arrangement of the plurality of second gate lines VG, the plurality of second common lines CL2, and the first auxiliary line VSS1 of the conductive line sets G of the two is different.

Please refer to FIG. 11. Specifically, in the present embodiment, each of the conductive line sets G includes a second common line CL2, a second common line CL2, a second gate line VG, a second common line CL2, a second common line CL2, a second gate line VG, a second common line CL2, a second common line CL2, and a first auxiliary line VSS1 sequentially arranged in the first direction D1.

Figure 12:
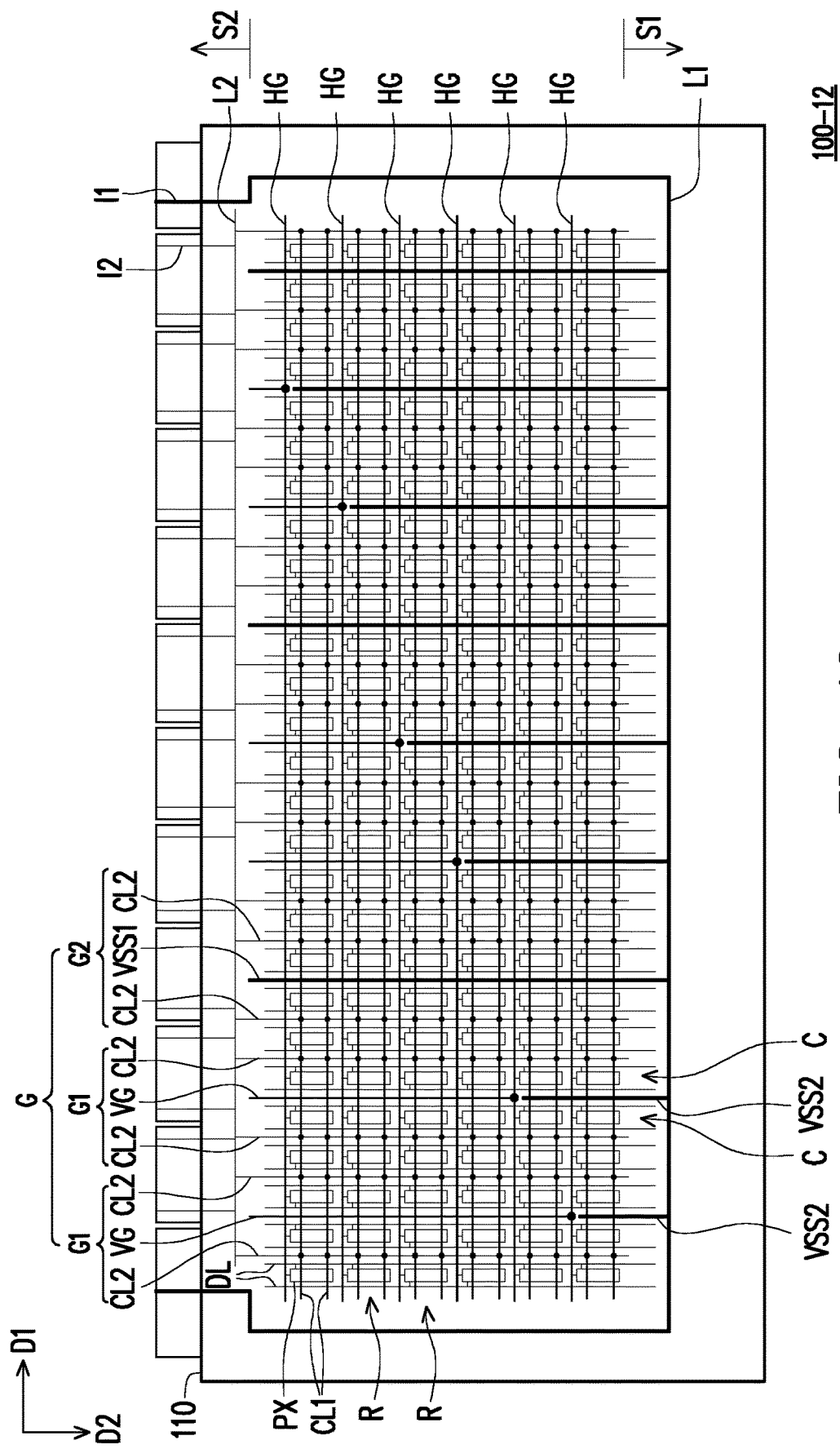
FIG. 12 is a diagram of a pixel array substrate 100-12 of an embodiment of the invention.

FIG. 12 is a diagram of a pixel array substrate 100-12 of an embodiment of the invention.

The pixel array substrate 100-12 of FIG. 12 is similar to the pixel array substrate 100-10 of FIG. 10, and the difference between the two is: the arrangement of the plurality of second gate lines VG, the plurality of second common lines CL2, and the first auxiliary line VSS1 of the conductive line sets G of the two is different.

Please refer to FIG. 12. In the present embodiment, the second gate line VG of each of the first conductive line groups G1 is disposed between the plurality of second common lines CL2 of the first conductive line group G1, and the first auxiliary line VSS1 of the second conductive line group G2 is disposed between the plurality of second common lines CL2 of the second conductive line group G2. That is, in the present embodiment, each of the conductive line sets G includes a second common line CL2, a second gate line VG, a second common line CL2, a second common line CL2, a second gate line VG, a second common line CL2, a second common line CL2, a first auxiliary line VSS1, and a second common line CL2 sequentially arranged in the first direction D1.

What is claimed is:

1. A pixel array substrate, comprising:
   a base;
   a plurality of data lines disposed on the base and arranged in a first direction;
   a plurality of first gate lines disposed on the base and arranged in a second direction staggered with the first direction;
   a plurality of pixel structures disposed on the base and electrically connected to the data lines and the first gate lines;
   a plurality of first common lines disposed on the base, arranged in the second direction, and overlapped with the pixel structures; and
   a plurality of conductive line sets disposed on the base and arranged in the first direction, wherein each of the conductive line sets comprises:
     a plurality of first conductive line groups, wherein each of the first conductive line groups comprises a plurality of second gate lines and a second common line, the second gate lines of each of the first conductive line groups are electrically connected to a plurality of first gate lines of the first gate lines, and the second common line of each of the first conductive line groups is electrically connected to at least one of the first common lines; and
     a second conductive line group, wherein the first conductive line groups and the second conductive line group are sequentially arranged in the first direction, the second conductive line group comprises a second gate line, a first auxiliary line, and a second common line, the second gate line of the second conductive line group is electrically connected to one of the first gate lines, and the second common line of the second conductive line group is electrically connected to at least one of the first common lines;
   wherein an arrangement order of the second gate lines and the second common line of each of the first conductive line groups in the first direction is the same as an arrangement order of the second gate line, the first auxiliary line, and the second common line of the second conductive line group in the first direction, respectively.

2. The pixel array substrate of claim 1, wherein a signal of the first auxiliary line of the second conductive line group and a gate-off signal of one of the second gate lines of one of the first conductive line groups are substantially the same.

3. The pixel array substrate of claim 1, wherein the first auxiliary line of the second conductive line group has a DC potential DC1, the second common line of one of the first conductive line groups has a DC potential DC2, and |DC1−DC1|>1 V.

4. The pixel array substrate of claim 1, wherein the pixel structures are arranged in a plurality of pixel columns, the pixel columns are arranged in the first direction, the plurality of pixel structures of each of the pixel columns are arranged in the second direction, and each of the first conductive line groups comprises:

a plurality of second auxiliary lines, wherein each of the second auxiliary lines and one of the second gate lines of the first conductive line group are disposed between two adjacent pixel columns, and each of the second auxiliary lines is structurally separated from the second gate line of the first conductive line group.

5. The pixel array substrate of claim 4, wherein the second auxiliary lines of the first conductive line group are electrically connected to the first auxiliary line of the second conductive line group.

6. The pixel array substrate of claim 1, wherein the second gate lines and the second common line of each of the first conductive line groups are sequentially arranged in the first direction, and the first auxiliary line, the second gate line, and the second common line of the second conductive line group are sequentially arranged in the first direction.

* * * * *